(12) United States Patent
Lin et al.

(10) Patent No.: US 6,362,055 B2
(45) Date of Patent: *Mar. 26, 2002

(54) METHOD OF GATE DOPING BY ION IMPLANTATION

(75) Inventors: Ming-Ren Lin; Bin Yu, both of Cupertino, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,527

(22) Filed: Aug. 31, 1998

(51) Int. Cl.[7] .......................................... H01L 21/8234
(52) U.S. Cl. ...................... 438/275; 438/527; 438/529; 438/283
(58) Field of Search ................................. 438/199, 217, 438/283, 142, 229, 230, 231, 232, 592, 275, 529

(56) References Cited

U.S. PATENT DOCUMENTS

| 5,683,941 | A | * | 11/1997 | Kao et al. ................... 438/592 |
| 5,723,356 | A | * | 3/1998 | Tsukamoto ................. 438/199 |
| 6,051,459 | A | * | 4/2000 | Gardner et al. ............. 438/231 |
| 6,054,354 | A | * | 4/2000 | Nowak et al. .............. 438/275 |

* cited by examiner

*Primary Examiner*—Carl Whitehead, Jr.
*Assistant Examiner*—Christy Novacek
(74) *Attorney, Agent, or Firm*—Foley & Lardner

(57) ABSTRACT

A semiconductor device includes a first gate stack and a second gate stack, each gate stack corresponding to a gate of a FET formed on the semiconductor device. The first gate stack includes a gate material formed from one of poly-silicon, poly-SiGe, and amorphous silicon. The gate material is implanted with a dopant of a first conductivity type at a first concentration. A metal silicide layer is formed over the doped gate material. The second gate stack includes a gate material formed from one of poly-silicon, poly-Si—Ge, and amorphous silicon. The gate material of the second gate stack is implanted with a dopant of a second conductivity type at a second concentration.

13 Claims, 3 Drawing Sheets n+ gate for n-MOSFET    p+ gate for p-MOSFET

METHOD OF GATE DOPING BY ION IMPLANTATION

BACKGROUND OF THE INVENTION

1. Field of the Invention

The present invention relates to a method and apparatus of MOSFET gate doping by having separate drain/source dopant implant and gate dopant implant.

2. Background of the Invention

For conventional very-large scale integration (VLSI) complementary metal oxide semiconductor (CMOS) technology, the gate electrode is doped at the same time when the source and the drain are doped. For such conventional CMOS devices, the gate material is formed from either polysilicon (poly-Si), polysilicon germanium (poly-SiGe), or amorphous silicon ($\alpha$-Si).

One of the disadvantages of the conventional approach is that the gate implantation dopant species has to be the same as that of the source and the drain, since the doping for the gate, source and drain is performed at the same time.

Another of the disadvantages of the conventional approach is caused due to the projections of the gate implantation and the source/drain implantation being close to each other. Because the source/drain junction depth is typically smaller than the gate stack thickness, the gate implantation may not be deep enough to suppress the gate depletion near the gate electrode/gate oxide interface. This gate depletion effect causes a degradation in the drive current of the transistor that is formed by the conventional approach.

Still another of the disadvantages of the conventional approach is that the gate implant has the same rapid thermal annealing (RTA) process as that of the source and drain. Because the source/drain (S/D) RTA process is limited by the shallow junction requirement, insufficient annealing may occur to the gate dopant, thereby causing high gate sheet resistance and gate depletion effect.

SUMMARY OF THE INVENTION

An object of the present invention is to form a MOSFET in which the gate depletion effect is lessened or eliminated.

Another object of the present invention is to form a MOSFET in which the gate dopant implant species is different from the source/drain dopant implant species.

Yet another object of the present invention is to form a MOSFET in which sufficient annealing is provided to the gate dopant.

These and other objects and advantages of the present invention are achieved by a method of forming a semiconductor device on a semiconductor substrate, the semiconductor device including a first MOSFET of a first conductivity type and a second MOSFET of a second conductivity type. The method includes a step of forming a gate oxide layer on the semiconductor substrate. The method also includes a step of forming a gate material on the gate oxide layer, where the gate material is one of poly-Si, poly-SiGe, and $\alpha$-Si. The method further includes a step of providing a first photo-resist on the gate material, the first photo-resist having at least one window over a first portion of the gate material. The method still further includes a step of providing a photo-lithography with an n+ type dopant, to thereby expose and implant the first portion of the gate material with the n+ type dopant.

The method also includes a step of striping the first photo-resist. The method further includes a step of providing a second photo-resist on the gate material, the second photo-resist having at least one window over a second portion of the gate material, the second portion being separate from the first portion. The method still further includes a step of providing a photo-lithography with a p+ type dopant, to thereby expose and implant the second portion of the gate material with the p+ type dopant. The method also includes a step of striping the second photo-resist, thereby exposing all portions of the gate material.

The method still further includes a step of depositing tungsten silicide ($WSi_x$) onto the gate material. The method also includes a step of providing a third photo-resist above the first and second portions of the gate material. The method further includes a step of etching the semiconductor device down to the semiconductor substrate, thereby leaving a first gate stack corresponding to a location of the first portion of the gate material, and a second gate stack corresponding to a location of the second portion of the gate material. The method still further includes a step of striping the third photo-resist, wherein the first gate stack corresponds to a gate of the first MOSFET of the first conductivity type, and the second MOSFET corresponds to a gate of the second MOSFET of the second conductivity type.

The above-mentioned objects and other advantages may also be achieved by a semiconductor device, which includes a first MOSFET of a first conductivity type and a second MOSFET of a second conductivity type. The first MOSFET includes a first gate stack having a first region of the first conductivity type having a gate material of a first concentration disposed therein. The second MOSFET includes a second gate stack having a second region of the second conductivity type having the gate material of a second concentration different from the first concentration. The gate material is one of poly-Si, poly-SiGe, and $\alpha$-Si.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENTS

The present invention will be discussed in detail below with reference to the drawings. FIGS. 1A–1H show process steps in creating a semiconductor device having a plurality of MOSFETs formed thereon, according to the present invention. Unlike the conventional processes discussed hereinabove, in the present invention the gate implantation is done before gate patterning, and is locally confined to the desired gate regions for either an n-channel or a p-channel MOSFET by using photo-resist as an implantation mask.

In the present invention, the gate dopant implantation is decoupled from the source/drain implantation. One advantage of having this decoupling is that, for either an n-channel or a p-channel MOSFET, the gate dopant species can be different from that used for the source and drain. Therefore, a degree of freedom is provided for the process design or device design to meet various application requirements.

Another advantage is that the projection of gate implantation can be made larger than that of the source/drain implantation. Therefore, gate depletion at the interface between the gate material layer and gate oxide layer can be suppressed.

Still another advantage is that the gate dopant can be annealed first, without the limitation set by the shallow source/drain junction. Sufficient gate dopant annealing helps to reduce the gate sheet resistance, which improves the circuit speed and AC performance. Sufficient gate dopant annealing also helps to suppress the gate depletion near the interface between the gate material layer and the gate oxide layer, which improves the transistor drive current, and hence the circuit speed.

Yet another advantage of the present invention is that, in the conventional silicidation process, the thickness of the gate silicide is the same as that of the source/drain silicide, which is limited by the source/drain junction depth. In the present invention, however, a $WSi_x$ layer is deposited separately from the source/drain silicide formation. Therefore, low gate sheet resistance can be achieved by using a reasonably thick $WSi_x$ layer on the gate.

Still another advantage of the present invention is that, for a poly-SiGe gate, the silicide (e.g., $TiSi_2$ or $CoSi_x$) on top of the gate is relatively difficult to form because of the high concentration of germanium (Ge). The use of tungsten silicide (e.g., $WSi_x$) instead, disposed on top of the gate, overcomes this conventional process difficulty.

Figure 1A:
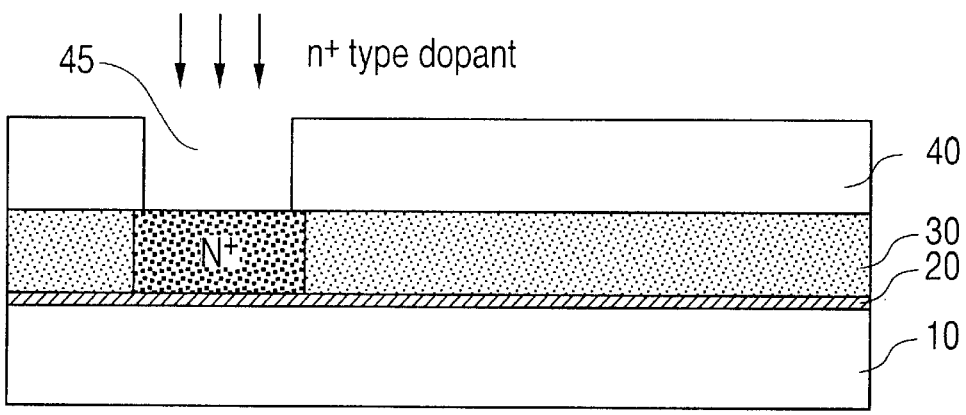
FIGS. 1A–1J show the various steps involved in making a MOSFET semiconductor device according to the present invention.

The various steps of forming a semiconductor device according to the present invention will be explained in detail below. FIG. 1A shows a silicon substrate 10, on which a thin layer of insulator 20, which acts as a gate insulator, is formed. This thin oxide layer 20 may be formed utilizing standard thermal growth techniques in an oxidation ambient. By way of example and not by way of limitation, the oxide layer 20 has a thickness of from 2 to 5 nanometers (nm). Of course, other thicknesses are possible, depending upon particular design considerations.

FIG. 1A also shows a gate material layer 30 formed on top of the oxide layer 20. The gate material layer 30 preferably is formed by using one of the following materials: polysilicon, poly-SiGe, or amorphous silicon. In the present invention, the gate material layer 30 is formed by any one of a number of deposition techniques (e.g., low pressure chemical vapor deposition, or LPCVD) that are well known in the art. By way of example and not by way of limitation, the gate material layer 30 has a thickness of from 100 to 300 nm.

The semiconductor structure is shown with a patterned photo-resist layer 40 formed on top of the gate material layer 30. The photo-resist layer 40 has a thickness of from 500 to 800 nm. The resist pattern is made so as to protect the areas where active devices will be formed. This patterning may be accomplished by means of standard lithography and etching techniques, which are well known in the art. In FIG. 1A, by way of example, the patterning of the photo-resist layer 40 creates a window or hole 45 by which a particular portion of the gate material layer 30 may be implanted with ions of a particular type.

After the photo-resist layer 40 has been patterned, an n+ type dopant, such as phosphorus, arsenic or aluminum, is then implanted onto the semiconductor structure. The region of the gate material layer 30 directly underneath the window or hole 45 is doped with the n+ type dopant, thereby forming an n+ region within the gate material layer 30. For ease in explanation, the region of the gate material layer 30 directly underneath the window or hole 45 will be called a first region.

Figure 1B:
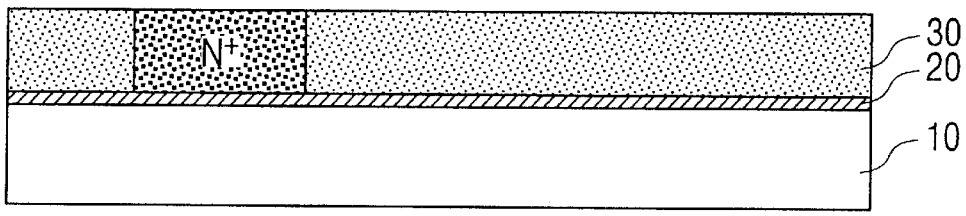

FIG. 1B shows the semiconductor substrate after the photo-resist layer 40 has been removed, or stripped, from the semiconductor substrate. The photo-resist layer 40 may be removed by any one of a variety of conventional techniques, such as by using an etch chemistry with an argon or oxygen plasma. After the photo-resist layer 40 has been removed, the entire gate material layer 30 is exposed.

Figure 1C:
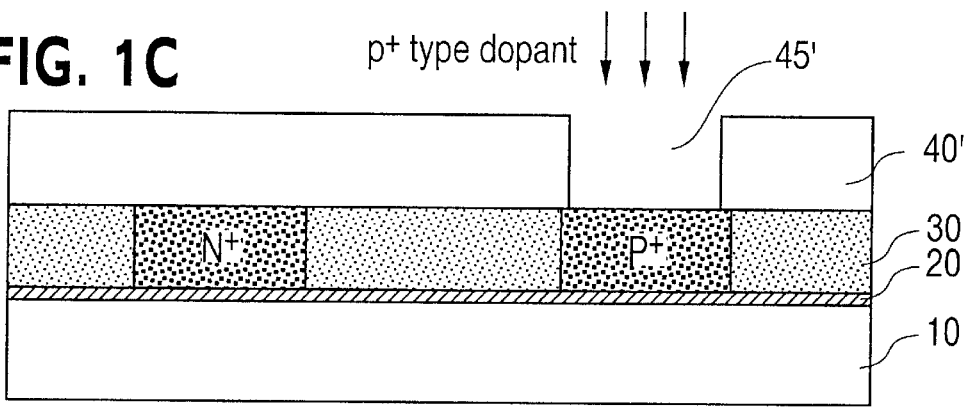

FIG. 1C shows the semiconductor substrate after a p+ dopant has been implanted onto a second region of the gate material layer 30. The formation of the p+ dopant on the second region of the gate material layer 30 is similar to the formation of the n+ dopant onto the first region of the gate material layer 30. That is, a photo-resist layer 40' is formed on the gate material layer 30. The photo-resist layer 40' is patterned by means of standard lithography and etching techniques, so as to create a window or hole 45' by which another particular portion of the gate material layer 30 may be implanted with ions of a particular type.

After the photo-resist layer 40 has been patterned, a p+ type dopant, such as boron (B), $BF_2$ or IN, is then implanted onto the semiconductor structure. The region of the gate material layer 30 directly underneath the window or hole 45 is doped with the p+ type dopant, thereby forming a p+ region, within the gate material layer 30. This p+ region corresponds to the second region discussed above.

Figure 1D:
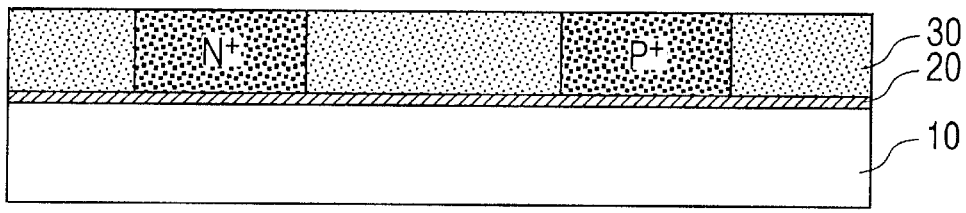

FIG. 1D shows the semiconductor substrate after the photo-resist layer 40' has been removed, or stripped, from the semiconductor substrate. The photo-resist layer 40' may be removed by the variety of conventional techniques discussed above with respect to the removal of the photo-resist layer 40. After the photo-resist layer 40' has been removed, the entire gate material layer 30, having an n+ doped region and a p+ doped region, is exposed to the exterior.

Figure 1E:
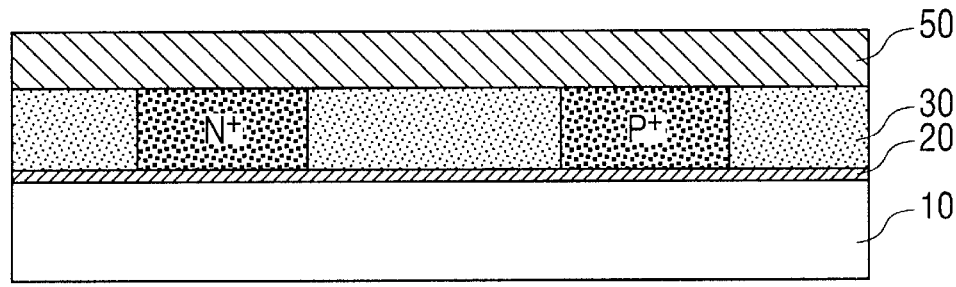

FIG. 1E shows the semiconductor substrate after a tungsten silicide layer ($WSi_x$) 50 has been deposited thereon. The $WSi_x$ layer 50 may be deposited onto the semiconductor structure by any one of a variety of conventional techniques for forming such a metal silicide layer, such as chemical vapor deposition (CVD). By way of example and not by way of limitation, the $WSi_x$ layer 50 has a thickness in the range of from 50 to 200 nm.

Figure 1F:
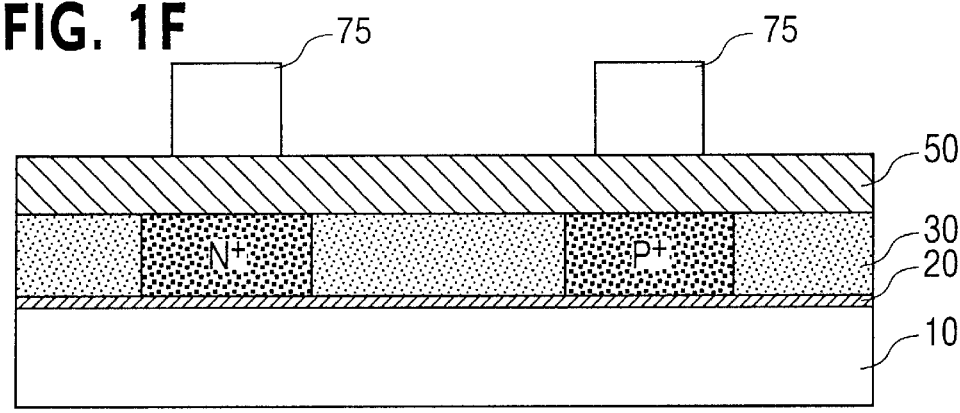

FIG. 1F shows a patterned layer 75 formed above the first and second regions of the gate material layer 30. The patterned layer 75 may be, for example, a conventional photo-resist that is patterned by any one of a variety of patterning processes.

Figure 1G:
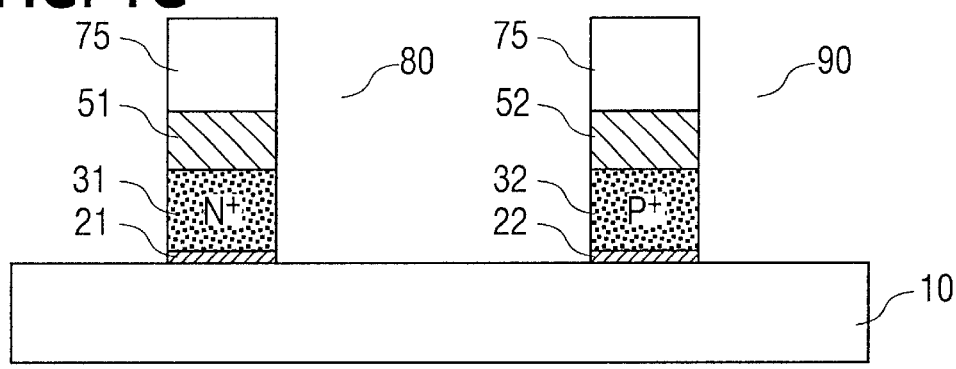

FIG. 1G shows the semiconductor substrate after an etching step has been conducted, in which a first gate stack 80 and a second gate stack 90 are formed. In a preferred embodiment, these openings are formed by directionally etching the top surface of semiconductor substrate after masking, using an anisotropic dry etch. The directional etch is utilized to form the first and second gate stacks 80, 90 with substantially vertical sidewalls down to the silicon substrate 10.

Figure 1H:
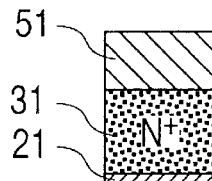
Figure 1H:
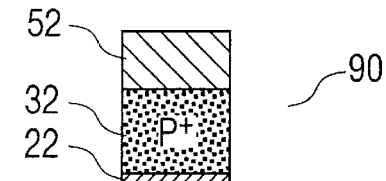
Figure 1H:
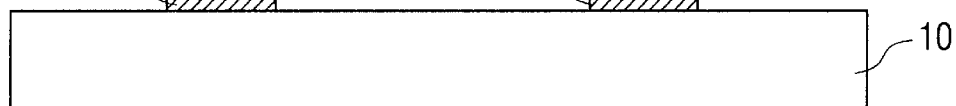
Figure 1I:
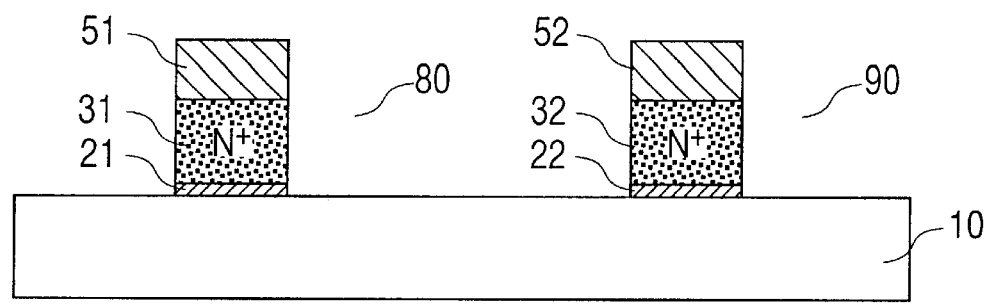
Figure 1J:
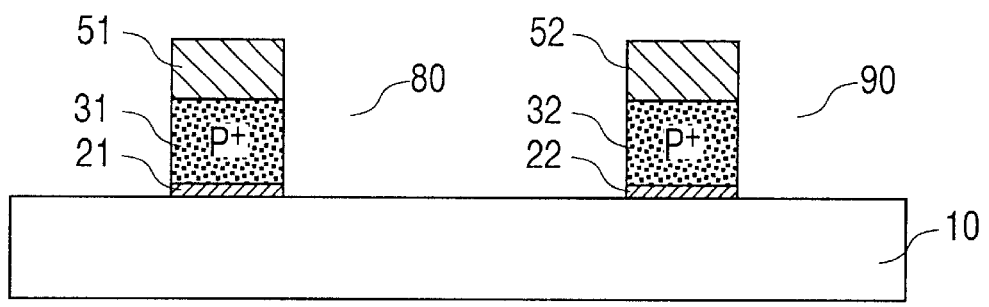

FIG. 1H shows the semiconductor substrate after the patterned layer 75 has been removed, or stripped. The first gate stack 80 has an oxide layer 21, an n+ doped gate material layer 31, and a tungsten silicide layer 51. The second gate stack 90 has an oxide layer 22, a p+ doped gate material layer 32, and a tungsten silicide layer 52. The first gate stack 80 may be used as a gate region for a MOSFET of a first conductivity type, and the second gate stack 90 may be used as a gate region for a MOSFET of a second conductivity type.

Though not shown in FIGS. 1A–1H, n-well and/or p-well regions are formed in the semiconductor substrate, to thereby form source and drain regions for the MOSFETs created on the semiconductor device. These regions may be formed with any type of dopant as required, without affecting the gate stacks already formed on the substrate. The WSi$_x$ layer of the gate stacks 80, 90 form a cap or barrier for any dopants used to form the source and drain regions. The formation of such source and drain regions is known to those of ordinary skill of the art, and is not discussed herein to provide a concise explanation of the present invention.

After the first and second gate stacks 80, 90 are formed on the silicon substrate 10, conventional follow-up processes can then be performed to provide the necessary connections among the different regions formed on the semiconductor device. For example, S/D doping, contact formation, and other steps are performed, which are known to those of ordinary skill in the art, and which are not discussed herein in order to provide a concise explanation of the present invention.

While a preferred embodiment has been described herein, modification of the described embodiment may become apparent to those of ordinary skill in the art, following the teachings of the invention, without departing from the scope of the invention as set forth in the appended claims.

For example, instead of having an n+ implant and then a p+ implant to form two separate transistors on a substrate, other types of implants may be utilized, such as forming an n+ implant of a first dosage onto a first region of a gate material, and then an n+ implant of a second dosage onto a second region of the gate material. By that process, two FETs of the same conductivity type, but having different characteristics, may be formed. Similarly, n- and/or p- implants may be performed to create different types of FETs on a substrate.

What is claimed is:

1. A method of forming a semiconductor device on a substrate, the method comprising:

forming a gate oxide layer on the substrate;

forming a gate material on the gate oxide layer;

forming a first photo-resist on the gate material, the first photo-resist having at least one window positioned over a first portion of the gate material;

implanting with an n+ type dopant of a first concentration, to thereby expose and implant the first portion of the gate material with the n+ type dopant of the first concentration, wherein only the first portion of the gate material above the substrate is doped during the implanting of the n+ dopant of the first concentration and wherein no regions within the substrate are doped with the n+ dopant of the first concentration;

removing the first photo-resist;

forming a second photo-resist on the gate material, the second photo-resist having at least one window positioned over a second portion of the gate material, the second portion being separate from the first portion;

implanting with the n+ type dopant of a second concentration different from the first concentration, to thereby expose and implant the second portion of the gate material with the n+ type dopant of the second concentration, wherein only the second portion of the gate material above the substrate is doped during the implanting of the n+ dopant of the second concentration and wherein no regions within the substrate are doped with the n+ dopant of the second concentration;

removing the second photo-resist, thereby exposing all portions of the gate material;

depositing a metal silicide as a dopant barrier onto the gate material, thereby forming a metal silicide layer;

providing a third photo-resist above the first and second portions of the gate material;

etching the semiconductor device down to the substrate, thereby leaving a first gate stack corresponding to a location of the first portion of the gate material, and a second gate stack corresponding to a location of the second portion of the gate material;

removing the third photo-resist, wherein the first gate stack corresponds to a gate of a first MOSFET of a first conductivity type having the first concentration, and the second gate stack corresponds to a gate of a second MOSFET of the first conductivity type having the second concentration; and doping the substrate to form at least one of a source and a drain region of the first and second MOSFETs after the step of depositing a metal silicide.

2. The method according to claim 1, wherein the first conductivity type is n.

3. The method according to claim 1, wherein the at least one window of the first and second photo-resists are formed by photo-lithography.

4. The method according to claim 1, wherein the first and second photo-resists are removed by stripping.

5. The method according to claim 1, wherein the metal silicide is tungsten silicide.

6. The method according to claim 1, wherein the n+ dopant is one of phosphorous and arsenic.

7. The method according to claim 1, wherein the gate material is one of poly-Si, poly-SiGe, and amorphous silicon.

8. A method of forming a semiconductor device on a substrate, the method comprising:

forming a gate oxide layer on the substrate;

forming a gate material on the gate oxide layer;

forming a first photo-resist on the gate material, the first photo-resist having at least one window positioned over a first portion of the gate material;

implanting with a p+ type dopant of a first concentration, to thereby expose and implant the first portion of the gate material with the p+ type dopant of the first concentration, wherein only the first portion of the gate material above the substrate is doped during the implanting of the p+ dopant of the first concentration and wherein no regions within the substrate are doped with the p+ dopant of the first concentration;

removing the first photo-resist;

forming a second photo-resist on the gate material, the second photo-resist having at least one window positioned over a second portion of the gate material, the second portion being separate from the first portion;

implanting with the p+ type dopant of a second concentration different from the first concentration, to thereby expose and implant the second portion of the gate material with the p+ type dopant of the second concentration, wherein only the second portion of the gate material above the substrate is doped during the implanting of the p+ dopant of the second concentration and wherein no regions within the substrate are doped with the p+ dopant of the second concentration;

removing the second photo-resist, thereby exposing all portions of the gate material;

depositing a metal silicide as a dopant barrier onto the gate material, thereby forming a metal silicide layer;

providing a third photo-resist above the first and second portions of the gate material;

etching the semiconductor device down to the substrate, thereby leaving a first gate stack corresponding to a location of the first portion of the gate material, and a second gate stack corresponding to a location of the second portion of the gate material;

removing the third photo-resist, wherein the first gate stack corresponds to a gate of a first MOSFET of a first conductivity type having the first concentration, and the second gate stack corresponds to a gate of a second MOSFET of the first conductivity type having the second concentration; and doping the substrate to form at least one of a source and a drain region of the first and second MOSFETs after the step of depositing a metal silicide.

9. The method according to claim 8, wherein the first conductivity type is p.

10. The method according to claim 8, wherein the first and second photo-resists are removed by stripping.

11. The method according to claim 8, wherein the p+ dopant is boron.

12. A method of forming a semiconductor device on a substrate, the method comprising:

forming a gate oxide layer on the substrate;

forming a gate material on the gate oxide layer;

forming a first photo-resist on the gate material, the first photo-resist having at least one window positioned over a first portion of the gate material;

implanting with an n+ type dopant of a first concentration, to thereby expose and implant the first portion of the gate material with the n+ type dopant of the first concentration;

removing the first photo-resist;

forming a second photo-resist on the gate material, the second photo-resist having at least one window positioned over a second portion of the gate material, the second portion being separate from the first portion;

implanting with the n+ type dopant of a second concentration different from the first concentration, to thereby expose and implant the second portion of the gate material with the n+ type dopant of the second concentration;

removing the second photo-resist, thereby exposing all portions of the gate material;

depositing a metal silicide as a dopant barrier onto the gate material, thereby forming a metal silicide layer;

providing a third photo-resist above the first and second portions of the gate material;

etching the semiconductor device down to the substrate, thereby leaving a first gate stack corresponding to a location of the first portion of the gate material, and a second gate stack corresponding to a location of the second portion of the gate material;

removing the third photo-resist, wherein the first gate stack corresponds to a gate of a first MOSFET of a first conductivity type having the first concentration, and the second gate stack corresponds to a gate of a second MOSFET of the first conductivity type having the second concentration;

annealing the gate of the first MOSFET and the gate of the second MOSFET; and doping the substrate to form at least one of a source and a drain region of the first and second MOSFETs after the step of depositing the metal silicide, wherein transistor drive current is improved by the annealing that is done before formation of the at least one of the source and the drain region of the first and second MOSFETs.

13. A method of forming a semiconductor device on a substrate, the method comprising:

forming a gate oxide layer on the substrate;

forming a gate material on the gate oxide layer;

forming a first photo-resist on the gate material, the first photo-resist having at least one window positioned over a first portion of the gate material;

implanting with a p+ type dopant of a first concentration, to thereby expose and implant the first portion of the gate material with the p+ type dopant of the first concentration;

removing the first photo-resist;

forming a second photo-resist on the gate material, the second photo-resist having at least one window positioned over a second portion of the gate material, the second portion being separate from the first portion;

implanting with the p+ type dopant of a second concentration different from the first concentration, to thereby expose and implant the second portion of the gate material with the p+ type dopant of the second concentration;

removing the second photo-resist, thereby exposing all portions of the gate material;

depositing a metal silicide as a dopant barrier onto the gate material, thereby forming a metal silicide layer;

providing a third photo-resist above the first and second portions of the gate material;

etching the semiconductor device down to the substrate, thereby leaving a first gate stack corresponding to a location of the first portion of the gate material, and a second gate stack corresponding to a location of the second portion of the gate material;

removing the third photo-resist, wherein the first gate stack corresponds to a gate of a first MOSFET of a first conductivity type having the first concentration, and the second gate stack corresponds to a gate of a second MOSFET of the first conductivity type having the second concentration;

annealing the gate of the first MOSFET and the gate of the second MOSFET; and doping the substrate to form at least one of a source and a drain region of the first and second MOSFETs after the step of depositing the metal silicide, wherein transistor drive current is improved by the annealing that is done before formation of the at least one of the source and the drain region of the first and second MOSFETs.

* * * * *